(12) United States Patent
Lee

(10) Patent No.: US 11,751,387 B2
(45) Date of Patent: Sep. 5, 2023

(54) SEMICONDUCTOR DEVICE

(71) Applicant: SK hynix Inc., Icheon-si (KR)

(72) Inventor: Go Hyun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/749,105

(22) Filed: May 19, 2022

(65) Prior Publication Data

US 2022/0278122 A1    Sep. 1, 2022

Related U.S. Application Data

(62) Division of application No. 16/931,395, filed on Jul. 16, 2020, now Pat. No. 11,367,732.

(30) Foreign Application Priority Data

Jan. 10, 2020    (KR) ........................ 10-2020-0003697

(51) Int. Cl.

| | | |
|---|---|---|
| *G11C 5/02* | (2006.01) | |
| *G11C 16/08* | (2006.01) | |
| *H10B 41/27* | (2023.01) | |
| *H01L 25/065* | (2023.01) | |
| *G11C 16/26* | (2006.01) | |
| *H10B 43/27* | (2023.01) | |

(52) U.S. Cl.
CPC .............. *H10B 41/27* (2023.02); *G11C 5/025* (2013.01); *G11C 16/08* (2013.01); *G11C 16/26* (2013.01); *H01L 25/0657* (2013.01); *H10B 43/27* (2023.02)

(58) Field of Classification Search
CPC ........... H01L 27/11556; H01L 25/0657; H01L 27/11582; H10B 41/27; H10B 43/27; G11C 5/025; G11C 16/08; G11C 16/26
See application file for complete search history.

(56) References Cited

U.S. PATENT DOCUMENTS

| | | | |
|---|---|---|---|
| 8,228,684 B2 * | 7/2012 | Losavio | .............. H01L 25/0657 |
| | | | 361/829 |
| 9,184,136 B2 | 11/2015 | Kim et al. | |
| 2008/0278932 A1 | 11/2008 | Tress | |
| 2016/0055912 A1 | 2/2016 | Lee et al. | |
| 2019/0057898 A1 | 2/2019 | Shim et al. | |
| 2019/0363074 A1 | 11/2019 | Sukekawa | |

* cited by examiner

*Primary Examiner* — Son L Mai

(57) ABSTRACT

A semiconductor device having a three-dimensional (3D) structure is disclosed. The semiconductor device includes a first chip configured to include a peripheral circuit, and a second chip stacked on the first chip that is configured to include a first memory cell array and a second memory cell array. A plurality of transfer circuits are configured to connect a plurality of row lines of the first memory cell array and a plurality of row lines of the second memory cell array to respective global row lines is divided between the first chip and the second chip.

14 Claims, 7 Drawing Sheets

SEMICONDUCTOR DEVICE

CROSS-REFERENCE TO RELATED APPLICATION

This patent document is a divisional application of a U.S. patent application Ser. No. 16/931,395, filed on Jul. 16, 2020, now issued as U.S. Pat. No. 11,367,732, which claims priority under 35 U.S.C. § 119 to, and the benefits of, Korean patent application No. 10-2020-0003697, filed on Jan. 10, 2020, which is hereby incorporated in its entirety by reference.

TECHNICAL FIELD

The technology and implementations disclosed herein generally relate to a semiconductor device having a three-dimensional (3D) structure.

BACKGROUND

In recent times, demand for higher-integration semiconductor devices has been increasing in order to satisfy consumer demand for superior performance and lower costs. Since the degree of integration of two-dimensional (2D), or one-dimensional (1D), semiconductor devices is mainly determined by the region or area occupied by a unit memory cell, the degree of integration of 2D or 1D semiconductor devices is greatly affected by technology of fine pattern forming. However, ultra-high-cost devices are generally needed for a higher degree of pattern miniaturization (i.e., finer patterns). Therefore, whereas the integration degree of 2D semiconductor devices is rapidly increasing, the range of applications for such 2D semiconductor devices is still limited. As an alternative, to overcome the above-mentioned limitations, three-dimensional (3D) semiconductor devices in which memory cells are arranged in a three-dimensional (3D) structure have recently been developed and are rapidly coming into widespread use.

SUMMARY

Various embodiments of the disclosed technology relate to a semiconductor device for allowing pass transistors to be distributed to a memory chip and a circuit chip, such that a size of the semiconductor device is reduced irrespective of the increasing number of stacks.

In an aspect of the disclosed technology, a semiconductor device may include a first chip configured to include a logic circuit, and a second chip stacked on the first chip, and configured to include a memory cell array. At least one transfer circuit configured to connect a row line of the memory cell array to a global row line may be distributed to each of the first chip and the second chip.

In another aspect of the disclosed technology, a semiconductor device may include a first chip configured to include a peripheral circuit, and a second chip stacked on the first chip, and configured to include a first memory cell array and a second memory cell array. A plurality of transfer circuits configured to connect a plurality of row lines of the first memory cell array and a plurality of row lines of the second memory cell array to a respective global row lines may be divided between the first chip and the second chip.

It is to be understood that both the foregoing general description, and the following detailed description, of the technology disclosed herein are illustrative and explanatory and intended to provide further explanation of the scope of the disclosure to those skilled in the art.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of a semiconductor device that substantially addresses one or more issues related to limitations or disadvantages of the related art. Some implementations of the disclosed technology suggest a semiconductor device for allowing pass transistors to be distributed to a memory chip and a circuit chip, such that the number of pass transistors disposed in each stack is reduced irrespective of the increasing number of stacks. The disclosed technology describes various semiconductor devices which have densely arranged pass transistors independent of a greater or growing number of stacks, such that performance of high-speed operations can be improved.

Reference will now be made in detail to aspects of the present disclosure, embodiments and examples of which are illustrated in the accompanying drawings. Wherever possible, the same reference numbers are used throughout the drawings to refer to the same or like portions.

In association with the embodiments of the present disclosure, specific structural and functional descriptions are disclosed only for illustrative purposes. The embodiments represent a limited number of possible embodiments. Embodiments of the present disclosure can be implemented in various ways without departing from the scope or spirit of the present disclosure.

In describing the present disclosure, the terms "first" and "second" may be used to describe multiple components, but the components are not limited by the terms in number or order. The terms may be used to distinguish one component from another component. For example, a first component may be called a second component and a second component may be called a first component without departing from the scope of the present disclosure.

The terms used in the present application are merely used to describe specific embodiments and are not intended to limit the present disclosure. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning in the context of the relevant art and should not be analyzed to have an ideal meaning or an excessively formal meaning unless clearly defined in the present application. The terminology used in the present disclosure is for the purpose of describing particular embodiments only and is not intended to limit the disclosure.

Figure 1:
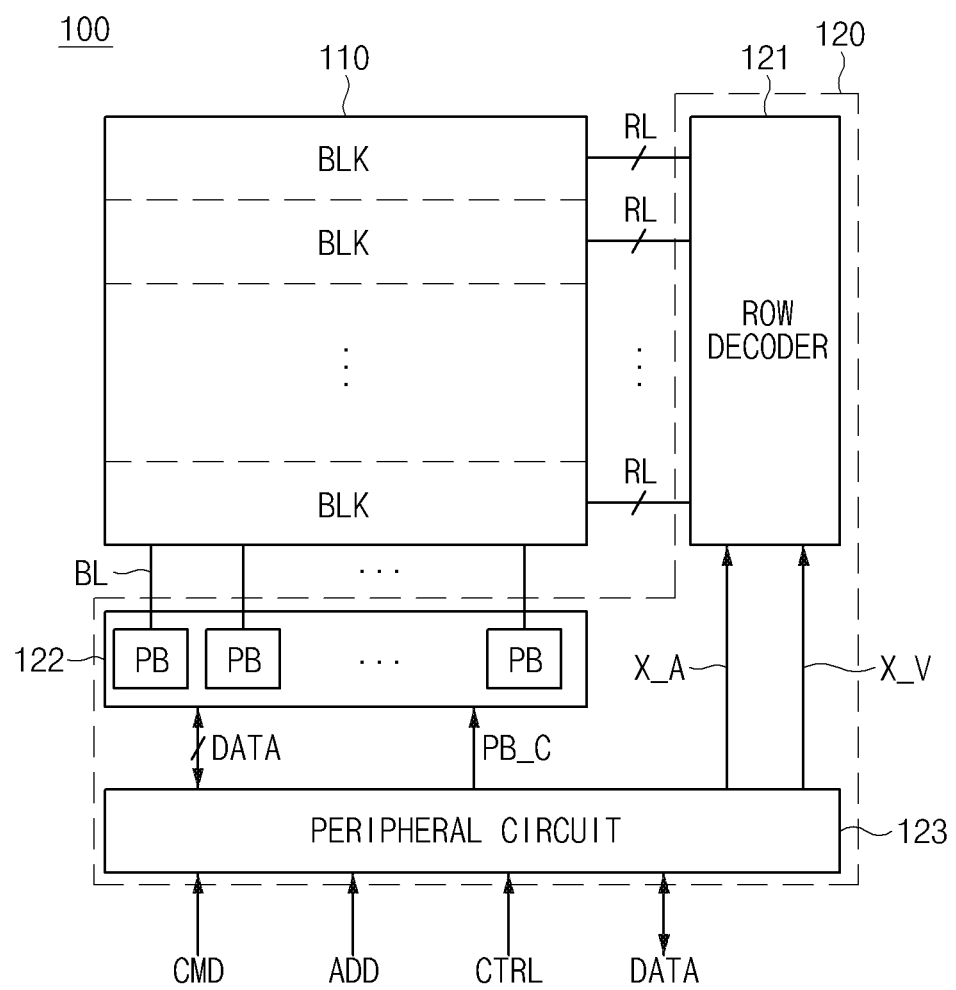
FIG. 1 is a block diagram illustrating an example of a semiconductor device in accordance with an embodiment of the disclosure.

FIG. 1 is a block diagram illustrating an example of a semiconductor device in accordance with an embodiment of the disclosure.

Referring to FIG. 1, a semiconductor device 100 may include a memory cell array 110 and a logic circuit 120. The logic circuit 120 may include a row decoder 121, a page buffer circuit 122, and a peripheral circuit 123.

The memory cell array 110 may include a plurality of memory blocks (BLK). Although not shown in FIG. 1, each memory block (BLK) may include a plurality of cell strings.

Each of the cell strings may include at least one drain selection transistor, a plurality of memory cells, and at least one source selection transistor, which are coupled in series to one another. A memory cell may be a volatile memory cell or a non-volatile memory cell. Although the semiconductor device 100 is implemented as a vertical NAND flash device for convenience of description, the scope or spirit of the disclosed technology is not limited thereto.

The memory cell array 110 may be coupled to the row decoder 121 through a plurality of row lines (RL). The row lines (RL) may include at least one drain selection line, a plurality of word lines, and at least one source selection line. The memory cell array 110 may be coupled to the page buffer circuit 122 through a plurality of bit lines (BL).

The row decoder 121 may select any one of the memory blocks (BLK) contained in the memory cell array 110 in response to a row address (X_A) from the peripheral circuit 123. In addition, the row decoder 121 may select one or more row lines contained in the memory cell array 110 upon receiving the row address (X_A) from the peripheral circuit 123. The row decoder 121 may transmit an operation voltage (X_V) received from the peripheral circuit 123 to the plurality of row lines (RL) coupled to the memory block that is selected from among the plurality of memory blocks (BLK) contained in the memory cell array 110.

The page buffer circuit 122 may include a plurality of page buffers (PB) respectively coupled to the plurality of bit lines (BL). The page buffer circuit 122 may receive a page buffer control signal (PB_C) from the peripheral circuit 123. The page buffer circuit 122 may transmit and receive data (DATA) to and from the peripheral circuit 123. The page buffer circuit 122 may control the plurality of bit lines (BL) arranged in the memory cell array 110 in response to a page buffer control signal (PB_C).

For example, the page buffer circuit 122 may detect a signal of any bit line (BL) of the memory cell array 110 in response to the page buffer control signal (PB_C), such that the page buffer circuit 122 detects data stored in any memory cell of the memory cell array 110 and transmits data (DATA) to the peripheral circuit 123 in response to the detected data. The page buffer circuit 122 may transmit a signal to the bit line (BL) based on the data (DATA) received from the peripheral circuit 123 in response to the page buffer control signal (PB_C), such that the page buffer circuit 122 may write data into the memory cell of the memory cell array 110. The page buffer circuit 122 may write data in a memory cell coupled to an activated word line, or may read out data from the memory cell.

The peripheral circuit 123 may receive a command (CMD), an address (ADD), and a control signal (CTRL) from an external part of the semiconductor device 100, and may transmit and receive data (DATA) to and from an external device (e.g., a memory controller) of the semiconductor device 100. The peripheral circuit 123 may write data in the memory cell array 110 based on the command (CMD), the address (ADD), and the control signal (CTRL). The peripheral circuit 123 may output signals (e.g., the row address (X_A), the page buffer control signal (PB_C), etc.) for reading output data from the memory cell array 110. The peripheral circuit 123 may generate not only the operation voltage (X_V), but also various voltages requested by the semiconductor device 100.

For convenience of description, two directions that are arranged to cross each other at a right angle while being parallel to a top surface of a substrate will hereinafter be defined as a first direction (FD) and a second direction (SD), and another direction vertically perpendicular to the top surface of the substrate will hereinafter be defined as a third direction (TD)

For example, the first direction (FD) may correspond to an extension direction of a row line (word line), and the second direction (SD) may correspond to an extension direction of a bit line. The first direction (FD) and the second direction may be substantially perpendicular to each other. The third direction (TD) may correspond to one direction perpendicular to each of the first direction (FD) and the second direction (SD). In the following description, the term "vertical" or "vertical direction" may be substantially identical to the third direction (TD) for convenience of description. In the drawings, a direction denoted by arrows and the direction opposite to the arrow direction will hereinafter be substantially identical to each other.

Figure 2:
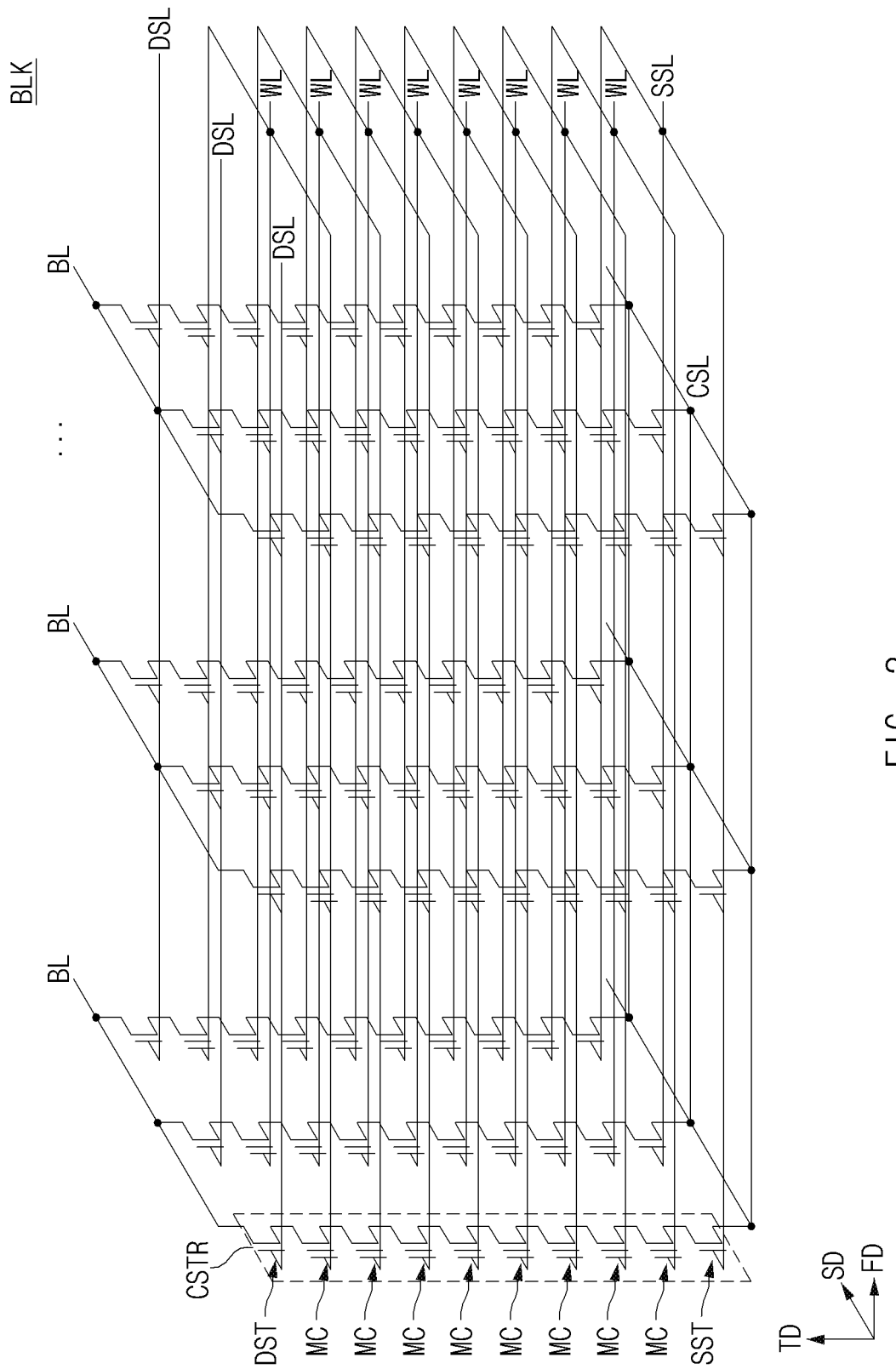
FIG. 2 is a schematic diagram illustrating a single equivalent circuit of a memory block of FIG. 1 in accordance with an embodiment of the disclosure.

FIG. 2 is a schematic diagram illustrating a single equivalent circuit of a memory block (BLK) of FIG. 1 in accordance with an embodiment of the disclosure.

Referring to FIG. 2, each of the memory blocks (BLK) may include a plurality of cell strings (CSTR) coupled between a common source line (CSL) and the plurality of bit lines (BL).

The bit lines (BL) may extend in the second direction SD, and may be arranged in the first direction (FD). The plurality of cell strings (CSTR) may be coupled in parallel to the plurality of bit lines (BL). The plurality of cell strings (CSTR) may be commonly coupled to the common source line (CSL). The plurality of cell strings (CSTR) may be disposed between a single common source line (CSL) and the plurality of bit lines (BL).

Each cell string (CSTR) may include a drain selection transistor (DST) coupled to the bit line (BL), a source selection transistor (SST) coupled to the common source line (CSL), and a plurality of memory cells (MC) coupled between the drain selection transistor (DST) and the source selection transistor (SST). The drain selection transistor (DST), the plurality of memory cells (MC), and the source selection transistor (SST) may be coupled in series to one another in the third direction (TD).

The plurality of drain selection lines (DSL), the plurality of word lines (WL), and the source selection line (SSL) may be arranged between the common source line (CSL) and the plurality of bit lines (BL). The drain selection lines (DSL) may be respectively coupled to gates of the drain selection transistors (DST) respectively corresponding to the drain selection lines (DSL). The word lines (WL) may be coupled to gates of the memory cells (MC) respectively corresponding to the word lines (WL). The source selection line (SSL) may be coupled to gates of the source selection transistors (SST). The plurality of memory cells (MC) commonly coupled to the single word line (WL) may constitute a single page.

Figure 3:
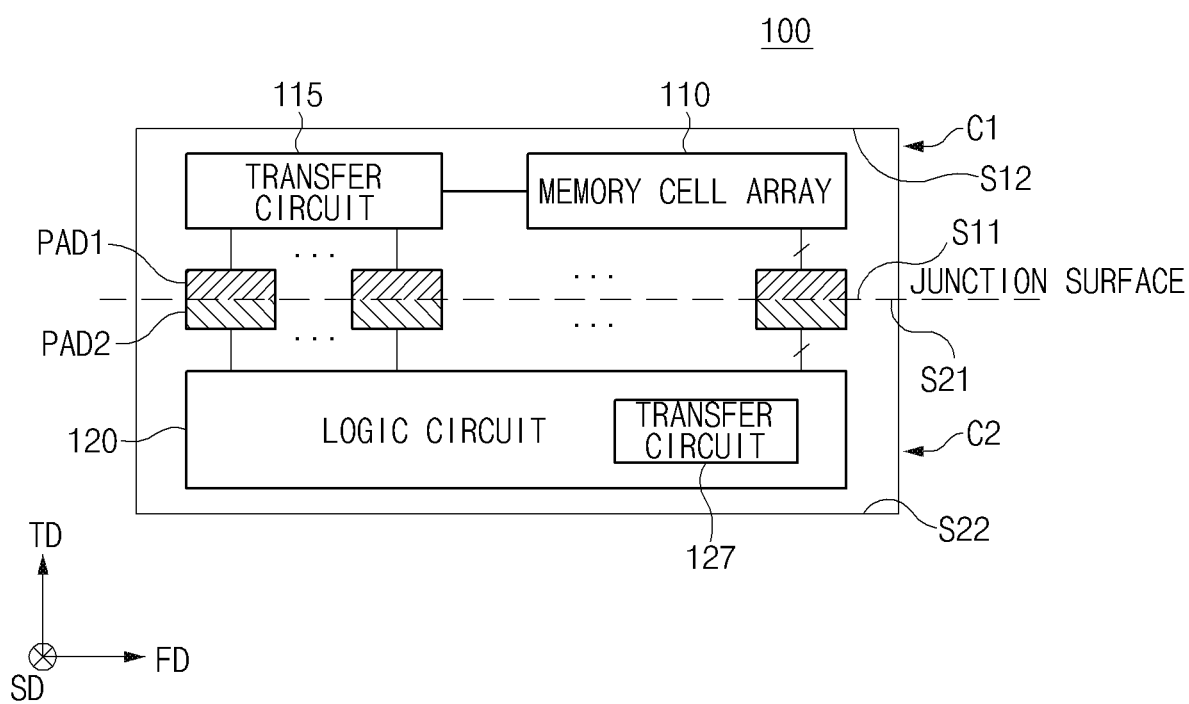
FIG. 3 is a block diagram illustrating an example of a semiconductor device in accordance with an embodiment of the disclosure.

FIG. 3 is a block diagram illustrating an example of a semiconductor device in accordance with an embodiment of the disclosure.

Referring to FIG. 3, a semiconductor device 100 may include a memory chip C1 (hereinafter referred to as a second chip) and a circuit chip C2 (hereinafter referred to as a first chip). In FIG. 3, the semiconductor device 100 may include a stacked structure in which the memory chip C1 is stacked on the circuit chip C2 in the third direction (TD) (i.e., the vertical direction).

The memory chip C1 may include a memory cell array 110 and a transfer circuit 115 (hereinafter referred to as a second transfer circuit), which are formed over a first substrate (not shown) in the third direction (TD) (i.e., the vertical direction). The memory chip C1 may include a first surface S11 and a parallel or substantially parallel second surface S12 in the first direction (FD). A plurality of first pads (PAD1) may be provided common to the first surface S11 of the memory chip C1. The first pads (PAD1) may be coupled to the memory cell array 110 and the transfer circuit 115.

The transfer circuit 115 may be disposed in the memory chip C1. The transfer circuit 115 may include a plurality of pass transistors configured to provide a high voltage received from a global row line (to be described later) to the memory cell array 110. The transfer circuit 115 may include half the number of pass transistors per plane unit (e.g., the number of row lines). For example, if the number of row lines (RL) (e.g., the number of word lines WL) contained in a memory cell array 110 is set to N, then the number of pass transistors contained in the transfer circuit 115 may be denoted by N/2.

The circuit chip (C2) may include a logic circuit 120 disposed over a second substrate (not shown) in the third direction (TD) (i.e., the vertical direction). As previously stated in FIG. 1, the logic circuit 120 may include a row decoder 121, a page buffer circuit 122, and a peripheral circuit 123. In addition, the logic circuit 120 may include a transfer circuit 127 (i.e., the first transfer circuit). The transfer circuit 127 may be included in the circuit chip C2. The transfer circuit 127 may be included in the row decoder 121. For convenience of description, only the transfer circuit 127 from among constituent elements of the row decoder 121 is illustrated in FIG. 3.

The transfer circuit 127 may include a plurality of pass transistors configured to provide a high voltage received from a global row line (to be described later) to a memory cell array 110 of the memory chip C1. The transfer circuit 127 may include half the number of pass transistors per plane unit.

For example, if the number of row lines (RL) (e.g., the number of word lines WL) contained in the memory cell array 110 is set to N, then the number of pass transistors contained in the transfer circuit 127 is denoted by N/2. In other words, from the viewpoint of a single plane unit, some pass transistors may be contained in the transfer circuit 115, and the remaining pass transistors may be contained in the transfer circuit 127.

The circuit chip C2 may include a surface S21 (hereinafter referred to as a first surface S21) and another parallel or substantially parallel surface S22 (hereinafter referred to as a second surface S22) in the first direction (FD). A plurality of second pads (PAD2) corresponding to a plurality of first pads (PAD1) may be provided common to the first surface S21 of the circuit chip C2. The second pads (PAD2) may be coupled to the logic circuit 120.

Surface S21 of the circuit chip C2 may be bonded to the first surface S11 of the memory chip C1, such that the first pads (PAD1) can be coupled to the second pads (PAD2) corresponding thereto. Each first pad (PAD1) and each second pad (PAD2) corresponding to the first pad (PAD1) may have substantially the same size, and may be arranged symmetrical to each other. For example, each first pad (PAD1) and each second pad (PAD2) may have a mirrored symmetrical structure across a junction surface defined by the bonding of the first surface S21 to the first surface S11.

The greater the number of stacks in the semiconductor device 100, the greater the number of required pass transistors. As a result, the region occupied by the row decoder may increase in size, and performance may deteriorate in high-speed operations. Therefore, in an example with a memory chip C1 and a circuit chip C2, the semiconductor device may include a transfer circuit 115, in the memory chip C1, having half the number of required pass transistors, may include a transfer circuit 127, in the circuit chip C2, having the remaining half of the pass transistors. Consequently, the region or area occupied by the row decoder can be reduced in proportion to the increasing number of stacks.

Figure 4:
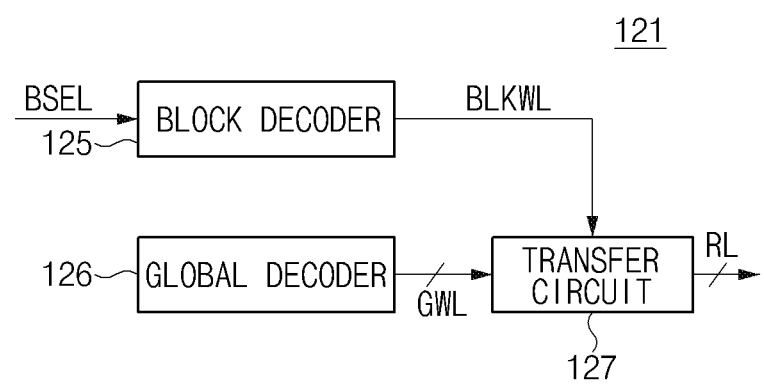
FIG. 4 is a block diagram illustrating an example of a row decoder of the logic circuit illustrated in FIG. 3 in accordance with an embodiment of the disclosure.

FIG. 4 is a block diagram illustrating an example of a row decoder 121 contained in a logic circuit 120 illustrated in accordance with an embodiment of the disclosure.

Referring to FIG. 4, a row decoder 121 may include a block decoder 125, a global decoder 126, and a transfer circuit 127. In accordance with an embodiment, the block decoder 125 and the global decoder 126 may be commonly provided to the plurality of memory blocks (BLK). In addition, the transfer circuit 127 may be connected to each memory block (BLK).

The block decoder 125 may provide a row line (i.e., a word line) selection signal (BLKWL) to a plurality of pass transistors of the transfer circuit 127. Upon receiving a block selection signal (BSEL) from the peripheral circuit 123, the block decoder 125 may transmit the row line selection signal (BLKWL), for selecting row lines (RL) of memory blocks (BLK), to the plurality of pass transistors.

The global decoder 126 may be coupled to the transfer circuit 127 through a plurality of global row lines (GWL). The global decoder 126 may transmit an operation voltage received from the peripheral circuit 123 to the transfer circuit 127 through the plurality of global row lines (GWL).

The transfer circuit 127 may be coupled to the memory blocks (BLK) through the plurality of row lines (RL). The transfer circuit 127 may be coupled to each of the global row lines (GWL) that correspond to the plurality of row lines (RL), respectively. The transfer circuit 127 may transmit a high voltage received from the plurality of global row lines (GWL) to the plurality of row lines (RL) in response to the row line selection signal (BLKWL).

Figure 5:
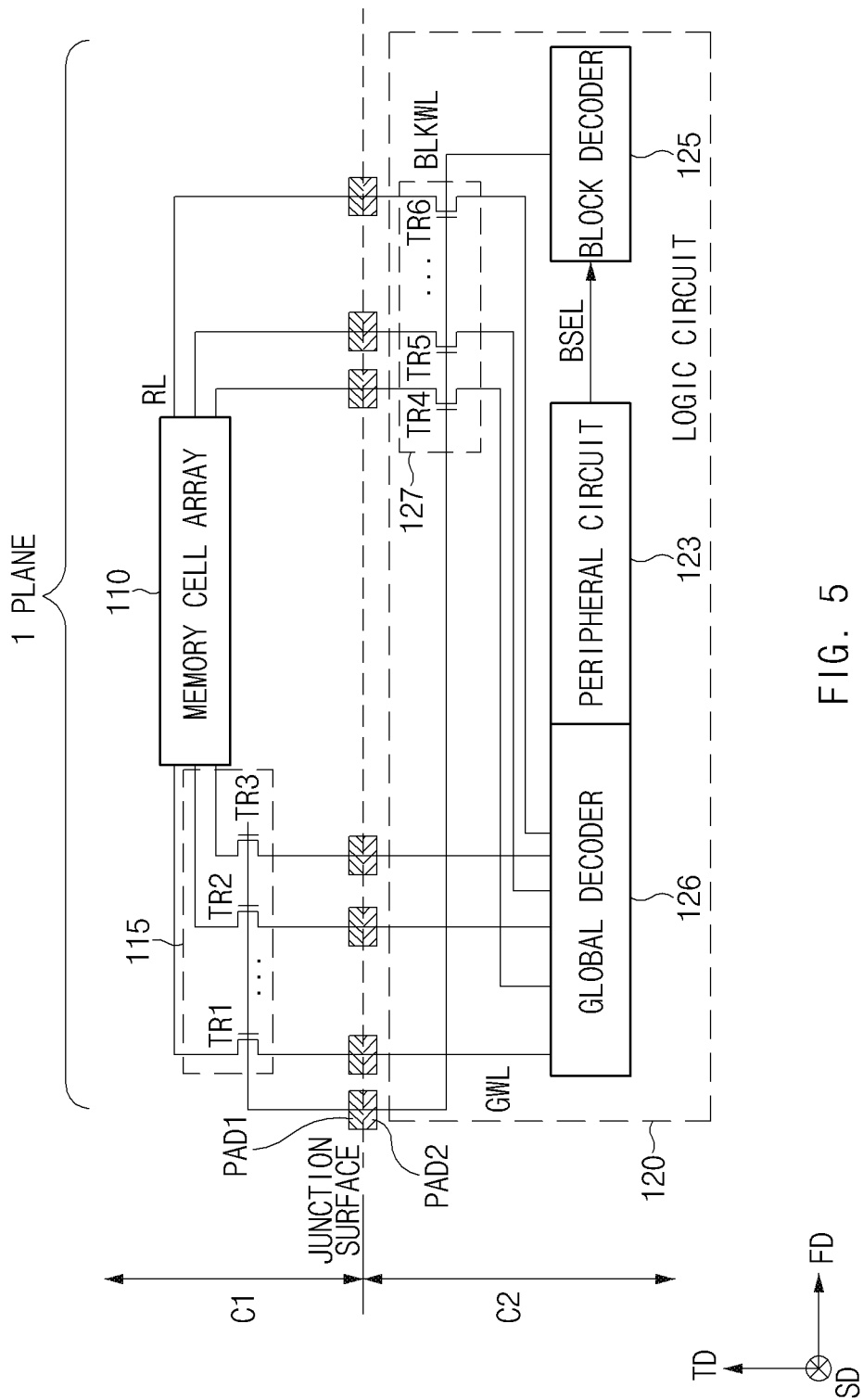
FIG. 5 illustrates an example of a detailed circuit diagram of the semiconductor devices shown in FIGS. 3 and 4 in accordance with embodiments of the disclosure.

FIG. 5 illustrates an example of a detailed circuit diagram the semiconductor devices shown in FIGS. 3 and 4 in accordance with an embodiment of the disclosure.

Referring to FIG. 5, a second transfer circuit 115 may be formed in the memory chip C1. The second transfer circuit 115 may include a plurality of pass transistors TR1~TR3 configured to provide a high voltage received from global row lines (GWL) to a memory cell array 110 in response to row line selection signal (BLKWL). The pass transistors TR1~TR3 of the second transfer circuit 115 may electrically couple a plurality of global row lines (GWL) to a plurality of row lines (RL) in response to row line selection signal (BLKWL). As a result, the pass transistors TR1~TR3 may be coupled between respective row lines (RL) of the memory cell array 110 and global row lines (GWL), such that the pass transistors TR1~TR3 may receive row line selection signal (BLKWL) through their respective gate terminals.

The second transfer circuit 115 may be located adjacent to the memory cell array 110. The second transfer circuit 115 may be coupled to a global decoder 126 formed in the circuit chip C2 through the pads PAD1 and PAD2 and global row lines (GWL). That is, the second transfer circuit 115 may be disposed over the global decoder 126 in the stacked structure. For example, when the memory cell array 110 is arranged in a center region, both the second transfer circuit 115 and the global decoder 126 may be arranged in the first directions (FD) at left edge regions of the memory chip C1 and circuit chip C2.

In addition, a first transfer circuit 127 may be formed in the circuit chip C2. The first transfer circuit 127 may include a plurality of pass transistors TR4~TR6 configured to provide a high voltage received from global row lines (GWL) to the memory cell array 110 in response to row line selection signal (BLKWL). The pass transistors TR4~TR6 may couple row lines (RL) of the memory cell array 110, and global row lines (GWL), such that the pass transistors TR4~TR6 may receive row line selection signal (BLKWL) through their respective gate terminals.

The first transfer circuit 127 may be located adjacent to the peripheral circuit 123 and the block decoder 125. The first transfer circuit 127 may be coupled to the memory cell array 110 formed in the memory chip C1 through the pads PAD1 and PAD2 and row lines (RL). For example, when the peripheral circuit 123 is arranged in the center region, both the transfer circuit 127 and the block decoder 125 may be arranged in the first directions (FD) at a right edge region of the circuit chip C2.

The first transfer circuit 127 of the circuit chip C2 and the second transfer circuit 115 of the memory chip C1 may receive, in common, row line selection signal (BLKWL) through the gate terminals of their respective pass transistors. Consequently, a line (or wire) of the row line selection signal (BLKWL), which is connected to circuit chip C2 and memory chip C1, may be formed of a metal line that extends.

For convenience of description and better understanding of the disclosed technology, it is assumed that the number of pass transistors needed for a single plane unit of the semiconductor device 100 is set to N. Each of the first and second transfer circuits 127 and 115 may include half the number of pass transistors as described above. For example, N/2 pass transistors TR1~TR3 may be included in the second transfer circuit 115, and the remaining N/2 pass transistors TR4~TR6 may be included in the first transfer circuit 127. In an embodiment of the disclosure, it has been described as an example that half the number of pass transistors are included in the first and second transfer circuits 127 and 115, respectively. However, the embodiment of the disclosure is not limited to this, and the number of pass transistors included in a transfer circuit can be changed.

Figure 6:
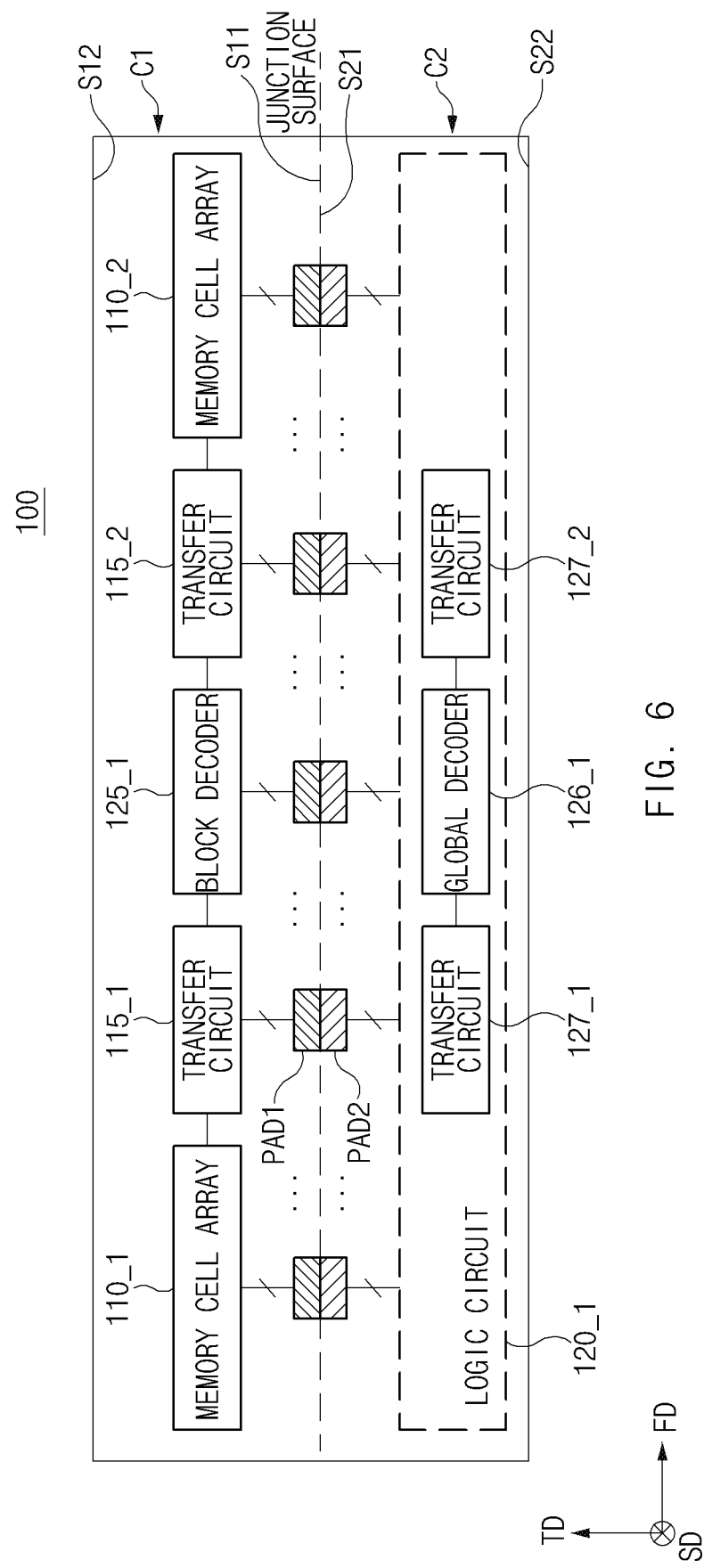
FIG. 6 is a schematic diagram illustrating another example of a semiconductor device in accordance with an embodiment of the disclosure.

FIG. 6 is a schematic diagram illustrating another example of a semiconductor device in accordance with an embodiment of the disclosure.

Referring to FIG. 6, a semiconductor device 100 may include a memory chip C1 (hereinafter referred to as a second chip) and a circuit chip C2 (hereinafter referred to as a first chip). In FIG. 6, the semiconductor device 100 may include a stacked structure in which the memory chip C1 is stacked on the circuit chip C2 in the third direction (TD) (i.e., the vertical direction).

The memory chip C1 may include memory cell arrays 110_1 and 110_2, a block decoder 125_1, and second transfer circuits 115_1 and 115_2 arranged in the first direction (FD) on a first substrate (not shown). The memory chip C1 may include a first surface S11 and a parallel or substantially parallel second surface S12 in the first direction (FD). A plurality of first pads (PAD1) may be provided common to the first surface S11 of the memory chip C1. The first pads (PAD1) may be coupled to the memory cell arrays 110_1 and 110_2, the block decoder 125_1, and the second transfer circuits 115_1 and 115_2.

The circuit chip C2 may include a logic circuit 120_1 formed over a second substrate (not shown) and may include a global decoder 126_1 and first transfer circuits 127_1 and 127_2.

As previously described in connection with FIG. 1, a logic circuit 120 may include a row decoder 121, a page buffer circuit 122, and a peripheral circuit 123. In FIG. 6, a logic circuit 120_1 may include a row decoder 121_1, a page buffer circuit 122_1, and a peripheral circuit 123_1 (not illustrated). Logic circuit 120_1 may include a plurality of first transfer circuits 127_1 and 127_2, and the first transfer circuits 127_1 and 127_2 may be included in the row decoder 121_1.

The block decoder 125_1, which is included in the row decoder 121_1, may be formed in the memory chip C1. In addition, the global decoder 126_1, included among constituent elements of the row decoder 121_1, may be formed in the circuit chip C2.

In addition, each of the second transfer circuit 115_1 and the first transfer circuit 127_1 corresponding to the memory cell array 110_1 may include half the number of pass transistors required by memory cell array 110_1. In addition, each of the second transfer circuit 115_2 and first transfer circuit 127_2 corresponding to the memory cell array 110_2 may include half the number of pass transistors required by memory cell array 110_2.

Figure 7:
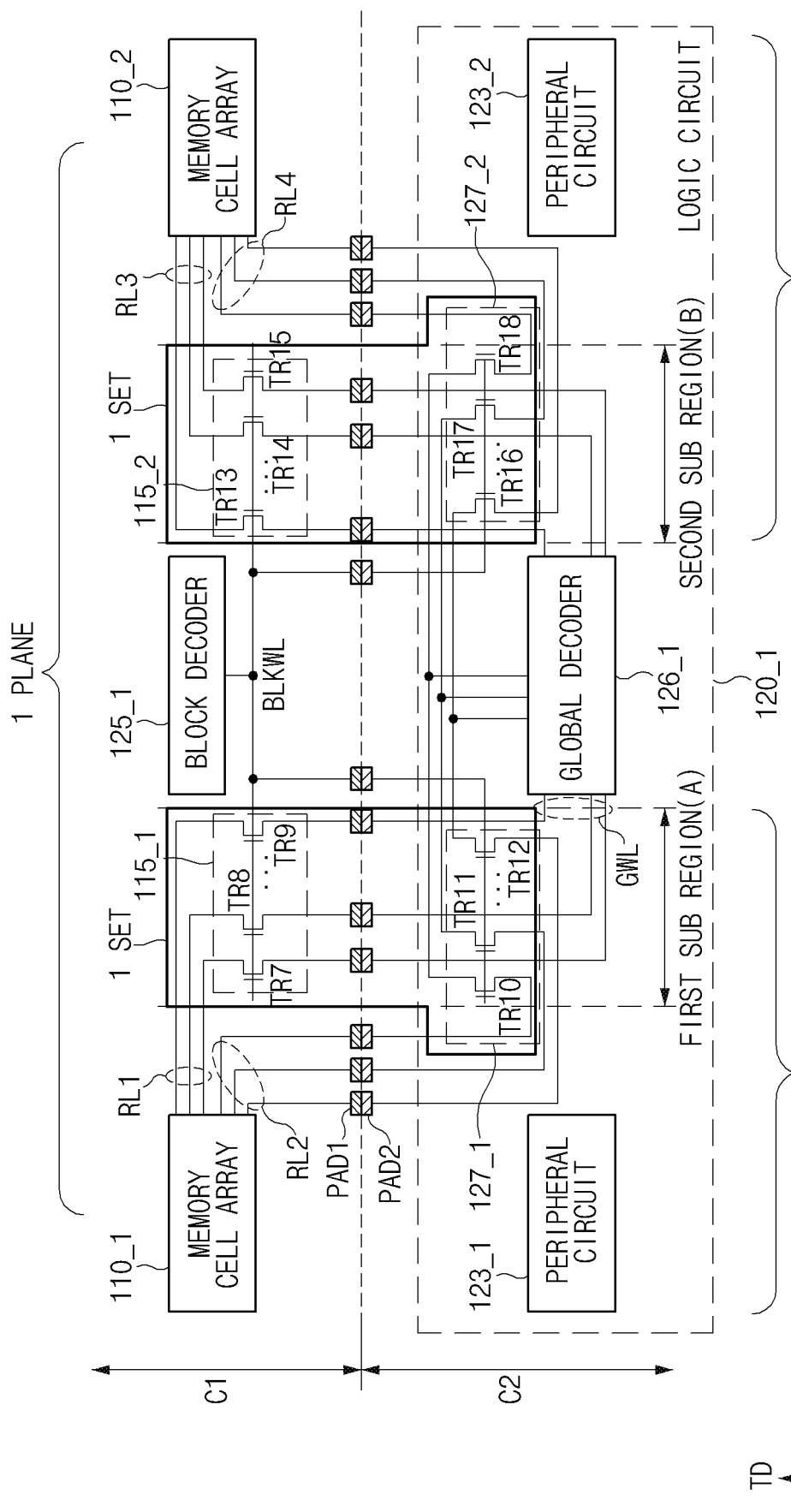
FIG. 7 illustrates an example of a detailed circuit diagram of a semiconductor device illustrated in FIG. 6 in accordance with an embodiment of the disclosure.

FIG. 7 illustrates a detailed circuit diagram of a semiconductor device shown in FIG. 6 in accordance with an embodiment of the disclosure.

Referring to FIG. 7, upper memory chip C1 is arranged over lower circuit chip C2 in the third direction (TD) (i.e., the vertical direction), and together comprise a plane unit. In the plane unit, block decoder 125_1, disposed on upper memory chip C1, is centrally arranged in the first directions (FD) over global decoder 126_1, disposed on lower circuit chip C2. First transfer circuit 127_1 and second transfer circuit 115_1, which correspond to the memory cell array 110_1, may be formed in a first sub region (A) located in a first sub plane with memory cell array 110_1. More specifically, the second transfer circuit 115_1 may be located adjacent to the memory cell array 110_1 in upper memory chip C1, and first transfer circuit 127_1 may be located adjacent to the peripheral circuit 123_1 in lower memory chip C2.

Second transfer circuit 115_1 may be disposed over first transfer circuit 127_1 in the third direction (TD) (i.e., the vertical direction). In addition, second transfer circuit 115_1 may be disposed between memory cell array 110_1 and block decoder 125_1 in the first direction (FD). First transfer circuit 127_1 may be disposed between peripheral circuit 123_1 and global decoder 126_1 in the first direction (FD).

Second transfer circuit 115_1 may include a plurality of pass transistors TR7~TR9 configured to provide a high voltage received from global row lines (GWL) to the memory cell array 110_1 in response to row line selection signal (BLKWL). The pass transistors TR7~TR9 may electrically couple a plurality of global row lines (GWL) to a plurality of row lines (RL) in response to row line selection signal (BLKWL). For example, the pass transistors TR7~TR9 may be coupled between a first set of row lines (RL1) and global row lines (GWL) common to the memory cell array 110_1, such that the pass transistors TR7~TR9 may receive the row line selection signal (BLKWL) through the pass transistor gate terminals.

First transfer circuit 127_1 may include a plurality of pass transistors TR10~TR12 configured to provide a high voltage received from global row lines (GWL) to the memory cell array 110_1 in response to row line selection signal (BLKWL). The pass transistors TR10~TR12 may electrically couple the plurality of global row lines (GWL) to a second set of row lines (RL2) in response to row line selection signal (BLKWL). For example, the pass transistors TR10~TR12 may be coupled between a second set of row lines (RL2) and global row lines (GWL) common to the memory cell array 110_1, such that the pass transistors TR10~TR12 may receive the row line selection signal (BLKWL) through respective gate terminals.

Second transfer circuit 115_2 and first transfer circuit 127_2 corresponding to a memory cell array 110_2 may be formed in a second sub region (B) located in a second sub plane with a memory cell array 110_2. The one plane unit may include the first sub plane and the second sub plane. The second transfer circuit 115_2 may be located adjacent to the memory cell array 110_2 at the upper memory chip C1, and the first transfer circuit 127_2 may be located adjacent to the peripheral circuit 123_2 at the lower circuit chip C2.

Second transfer circuit 115_2 may be disposed over first transfer circuit 127_2 in the third direction (TD) (i.e., the vertical direction). In addition, second transfer circuit 115_2 may be disposed between block decoder 125_1 and the memory cell array 110_2 in the first direction (FD). First transfer circuit 127_2 may be disposed between global decoder 126_1 and peripheral circuit 123_2 in the first direction (FD).

Second transfer circuit 115_2 may include a plurality of pass transistors TR13~TR15 configured to provide a high voltage received from global row lines (GWL) to the memory cell array 110_2 in response to row line selection signal (BLKWL). The pass transistors TR13~TR15 may electrically couple a plurality of global row lines (GWL) to a plurality of row lines (RL) in response to the row line selection signal (BLKWL). For example, the pass transistors TR13~TR15 may be coupled between a third set of row lines (RL3) and global row lines (GWL) common to the memory cell array 110_2, such that the pass transistors TR13~TR15 may receive the row line selection signal (BLKWL) through the pass transistor gate terminals.

First transfer circuit 127_2 may include a plurality of pass transistors TR16~TR18 configured to provide a high voltage received from global row lines (GWL) to the memory cell array 110_2 in response to row line selection signal (BLKWL). The pass transistors TR16~TR18 may electrically couple the plurality of global row lines (GWL) to a plurality of row lines (RL) in response to row line selection signal (BLKWL). For example, the pass transistors TR16~TR18 may be coupled between a fourth set of row lines (RL4) and global row lines (GWL) common to the memory cell array 110_2, such that the pass transistors TR16~TR18 may receive row line selection signal (BLKWL) through their respective gate terminals.

For convenience of description and better understanding of the disclosed technology, in an example, one each of memory cell arrays 110_1 and 110_2 is included in one plane unit of the semiconductor device 100, for a total of two (2) memory cell arrays. As a result, with respect to one plane unit, the second and first transfer circuits 115_1, 115_2, 127_1, and 127_2 together include two sets of pass transistors.

In addition, in an example, the number of row lines in the row lines RL1 and RL2 of the memory cell array 110_1 total N, and the number of row lines in the row lines RL3 and RL4 of the memory cell array 110_2 also total N.

As a result, the number of pass transistors coupled to one second transfer circuit 115_1 may be denoted by N/2. The number of pass transistors coupled to one first transfer circuit 127_1 may be denoted by N/2. Therefore, the second transfer circuit 115_1 and the first transfer circuit 127_1 are grouped into one set, such that the number of pass transistors corresponding to the memory cell array 110_1 may be denoted by N, which is the same as the number of row lines RL1 and RL2.

In the first sub plane, some pass transistors TR7~TR9 corresponding to the memory cell array 110_1 may be included in the second transfer circuit 115_1 of the memory chip C1, and remaining pass transistors TR10~TR12 may be included in the first transfer circuit 127_1 of the circuit chip C2.

The number of pass transistors coupled to the second transfer circuit 115_2 may be denoted by N/2. The number of pass transistors coupled to the first transfer circuit 127_2 may be denoted by N/2. Therefore, the second transfer circuit 115_2 and the first transfer circuit 127_2 are grouped into one set, such that the number of pass transistors corresponding to the memory cell array 110_2 may be denoted by N (identical to the number of row lines RL3 and RL4).

In the second sub plane, some pass transistors TR13~TR15 corresponding to the memory cell array 110_2 may be included in the second transfer circuit 115_2 of the memory chip C1, and the remaining pass transistors TR16~TR18 may be included in the first transfer circuit 127_2 of the circuit chip C2.

As described above, the block decoder 125_1 may be arranged in the center region of the plane unit disposed in the first direction (FD) between the second transfer circuits 115_1 and 115_2 in memory chip C1. The global decoder 126_1 may be arranged in the center region of the plane unit disposed in the first direction (FD) between the first transfer circuits 127_1 and 127_2 in circuit chip C2. In other words, the global decoder 126_1 may be formed below the block decoder 125_1 in the third direction (TD) (i.e., the vertical direction). As described above, the semiconductor device according to the embodiments may enable the plurality of pass transistors to be arranged in a distributed manner, such that the region occupied by a row decoder can be reduced in size.

As is apparent from the above description, the semiconductor device according to the embodiments of the disclosed technology can reduce the device footprint by distributing pass transistors to minimize size, to increase the degree of integration in the device such that high-speed performance can be improved.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a first chip configured to include a peripheral circuit; and
   a second chip stacked on the first chip, and configured to include a first memory cell array and a second memory cell array,
   wherein a plurality of transfer circuits configured to connect a plurality of row lines of the first memory cell array and a plurality of row lines of the second memory cell array to respective global row lines is divided between the first chip and the second chip
   wherein the first chip includes:
   a first transfer circuit configured to connect a global row line to a row line of the first memory cell array in response to a row line selection signal;
   a second transfer circuit configured to connect the global row line to a row line of the second memory cell array in response to the row line selection signal; and
   a global decoder configured to provide an operation voltage to each of the first transfer circuit, the second transfer circuit, and a transfer circuit disposed in the second chip through the global row line.

2. The semiconductor device according to claim 1, wherein the first transfer circuit includes:
   a plurality of pass transistors coupled between respective global row lines and row lines of the first memory cell array, and configured to receive the row line selection signal,
   wherein the plurality of pass transistors is coupled to the row lines of the first memory cell array through a plurality of pads common to an interface between the first chip and the second chip.

3. The semiconductor device according to claim 2, wherein the plurality of pass transistors is coupled to the row lines of the first memory cell array.

4. The semiconductor device according to claim 1, wherein the second transfer circuit includes:
   a plurality of pass transistors coupled between corresponding global row lines and row lines of the second memory cell array, and configured to receive the row line selection signal,
   wherein the plurality of pass transistors is coupled to the row lines of the second memory cell array through a plurality of pads common to an interface between the first chip and the second chip.

5. The semiconductor device according to claim 4, wherein the plurality of pass transistors is coupled to the row lines of the second memory cell array.

6. The semiconductor device according to claim 1, wherein the second chip includes:
   a third transfer circuit configured to connect global row lines to row lines of the first memory cell array in response to the row line selection signal;
   a fourth transfer circuit configured to connect the global row lines to row lines of the second memory cell array in response to the row line selection signal; and
   a block decoder configured to provide the row line selection signal to each of the third transfer circuit, the fourth transfer circuit, and a transfer circuit disposed in the first chip in response to a block selection signal.

7. The semiconductor device according to claim 6, wherein the third transfer circuit includes:
   a plurality of pass transistors coupled between the global row lines and the row lines of the first memory cell array, and configured to receive the row line selection signal through gate terminals thereof,
   wherein the plurality of pass transistors is coupled to the global row lines of the first chip through a plurality of pads common to an interface between the first chip and the second chip.

8. The semiconductor device according to claim 7, wherein the plurality of pass transistors is coupled to remaining row lines of the first memory cell array.

9. The semiconductor device according to claim 6, wherein the fourth transfer circuit includes:
   a plurality of pass transistors coupled between the global row lines and the row lines of the second memory cell array, and configured to receive the row line selection signal through gate terminals thereof,
   wherein the plurality of pass transistors is coupled to the global row lines of the first chip through a plurality of pads common to an interface between the first chip and the second chip.

10. The semiconductor device according to claim 9, wherein the plurality of pass transistors is coupled to remaining row lines of the second memory cell array.

11. The semiconductor device according to claim 1, further comprising:
    a plurality of first pads common to a first surface of the first chip; and
    a plurality of second pads common to a first surface of the second chip.

12. The semiconductor device according to claim 11, wherein each of the plurality of first pads and each of the plurality of second pads are bonded to each other.

13. The semiconductor device according to claim 11, wherein:
    the plurality of first pads is coupled to the peripheral circuit and the plurality of transfer circuits disposed in the first chip; and
    the plurality of second pads is coupled to the first memory cell array, the second memory cell array and the plurality of transfer circuits disposed in the second chip.

14. The semiconductor device according to claim 13, wherein an operation voltage and the row line selection signal are received by the plurality of transfer circuits through the plurality of first pads and the plurality of second pads.

\* \* \* \* \*